US008292649B2

(12) United States Patent
Yeh

(10) Patent No.: US 8,292,649 B2

(45) Date of Patent: Oct. 23, 2012

(54) SOCKET CONNECTOR HAVING STIFFENER PROVIDED WITH LATCH-ENABLED STANDOFF

(75) Inventor: Cheng-Chi Yeh, New Taipei (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/015,472

(22) Filed: Jan. 27, 2011

(65) Prior Publication Data

US 2011/0195588 A1 Aug. 11, 2011

(30) Foreign Application Priority Data

Feb. 8, 2010 (TW) ................................ 99202571 U

(51) Int. Cl.
*H01R 13/62* (2006.01)

(52) U.S. Cl. ........................................................ 439/331

(58) Field of Classification Search ................... 439/331
See application file for complete search history.

(56) References Cited

U.S. PATENT DOCUMENTS 7,402,065 B1 * 7/2008 Polnyi ........................... 439/331
7,556,522 B2 7/2009 Ma

* cited by examiner

*Primary Examiner* — Phuong Dinh

(74) *Attorney, Agent, or Firm* — Wei Te Chung; Ming Chieh Chang

(57) ABSTRACT

A socket connector comprises a housing having a plurality of contacts revived therein, a stiffener coupled with the housing and defining a plurality of mounting holes, and a plurality of standoffs each inserted into a mounting holes of the stiffener. Each standoff defines at least one post positioning the standoff in the mounting hole and at least one latch member grasping edge of the mounting hole.

9 Claims, 6 Drawing Sheets

SOCKET CONNECTOR HAVING STIFFENER PROVIDED WITH LATCH-ENABLED STANDOFF

BACKGROUND OF THE INVENTION

1. Field of the Invention

The present invention relates to a socket connector, and more particularly to a socket connector provided with latch-enabled standoff securely attached thereto avoids accidentally falling off therefrom.

2. Description of Prior Art

A land grid array connector electrically connecting an IC package to a PCB is described in U.S. Pat. No. 7,556,522, issued to Ma on Jul. 7, 2009. The connector comprises a housing having a plurality of contacts received therein, a stiffener coupled with the housing and defining a first window surrounding the housing and a plurality of non-circular mounting holes, a lever and a cover respectively mounted at a front and a rear portion of the stiffener, and a plurality of standoffs inserted into the mounting holes of the stiffener. Each mounting hole has a long diameter and a short diameter. On the other hand, each standoff 90 incorporated with the mounting hole comprises a circular base portion 91 and an insertion portion 92.

The insertion portions 92 of the standoffs 90 are inserted in the mounting holes 502 from a bottom-to-top direction. The teeth 921 of the standoff 90 couple with the arc shaped edges 5021 of the mounting hole 502 of the stiffener.

Each standoff is retained in the mounting hole by teethe 921 interferingly engaging with an inner wall of the mounting hole 502. Thus, dimension tolerance of teeth 921 and the mounting holes 502 are required to be strictly controlled. Obviously, manufacture cost will be increased by doing this. Moreover, reliability of interconnecting engagement between will decrease after the connector is used for a certain time, thus the standoffs will easily fall off from the mounting holes in transit.

In view of the above, a socket connector with improved standoff-equipped stiffener that overcomes the above-mentioned disadvantages is desired.

SUMMARY OF THE INVENTION

Accordingly, an object of the present invention is to provide a socket connector having improved standoff provided with latch members capable of being securely attached to a stiffener thereby preventing the standoff from falling off from the mounting hole of the stiffener.

To achieve the above-mentioned object, a socket connector is provided and comprises a housing having a plurality of contacts revived therein, a stiffener coupled with the housing and defining a plurality of mounting holes, and a plurality of standoffs inserted into the mounting holes of the stiffener. Each standoff defines at least one post for positioning the standoff in the mounting hole and at least one latch member grasping edge of the mounting hole to securely attach thereto. The latch member acts the (serves a) role of preventing the standoff from falling off from the mounting hole of the stiffener.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Figure 1:
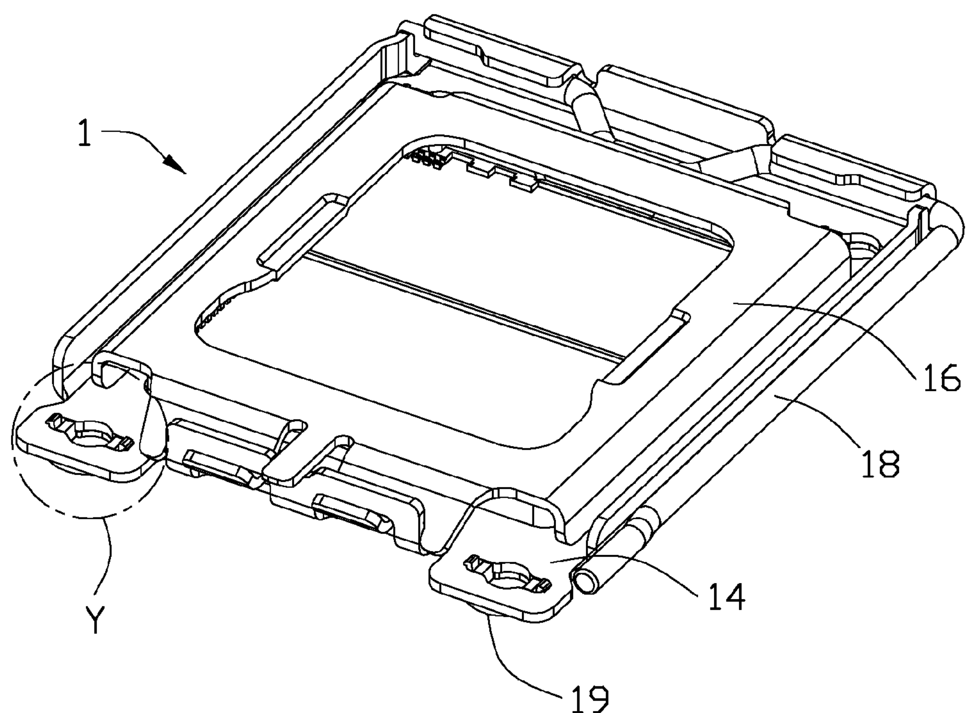
FIG. 1 is an isometric, assembled view of a socket connector in accordance with a preferred embodiment of the present invention.

Reference will now be made to the drawings to describe the present invention in detail.

Referring to FIGS. 1-6, the socket connector 1 for interconnecting two electronic components of the present invention comprises an insulative housing 10 with a number of contacts 12 received therein, a stiffener 14 seated properly to surround the insulative housing 10, a cover 16 pivotably mounted at a rear portion of the stiffener 14 and a lever 18 pivotably mounted at a front portion of the stiffener 14. The cover 16 and lever 18 are used for securing the IC package in the housing 10 jointly with the stiffener 14.

Figure 2:
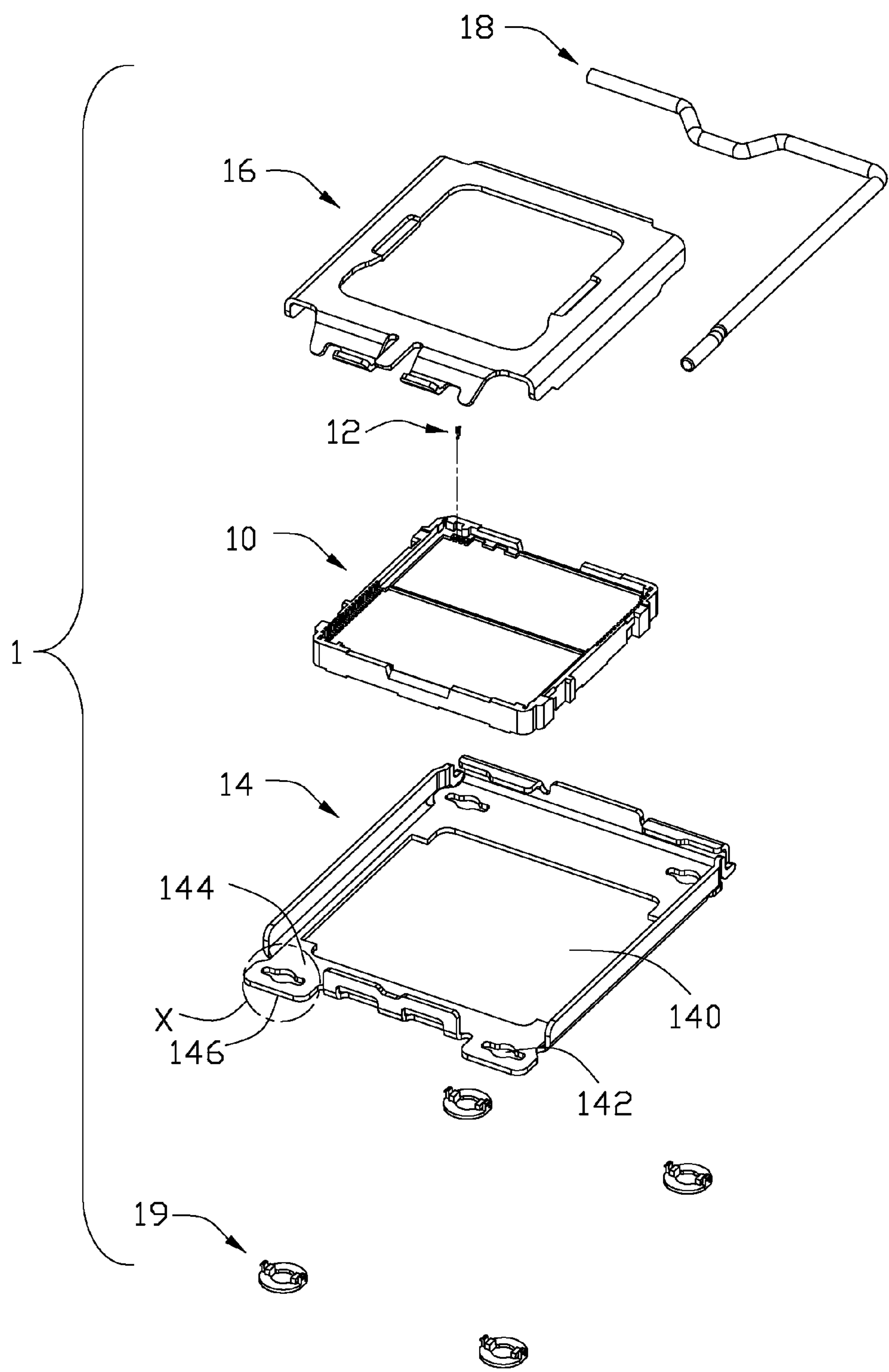
FIG. 2 is an isometric, exploded view of the socket connector as shown in FIG. 1.
Figure 3:
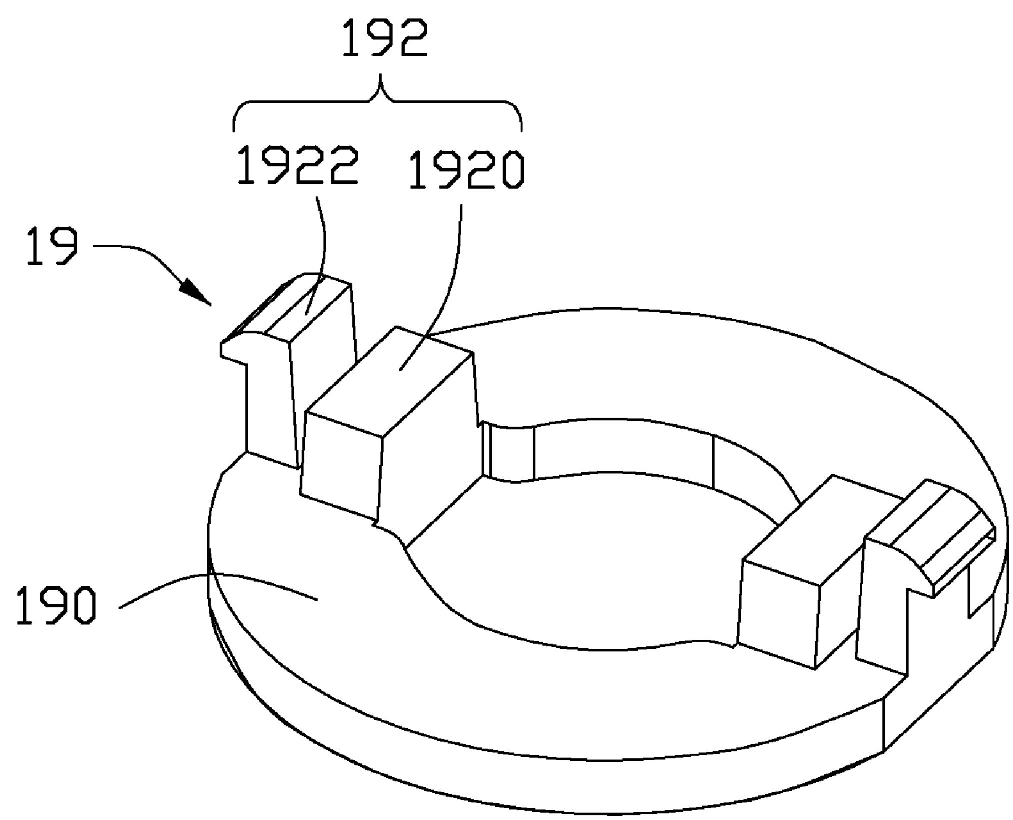
FIG. 3 is an isometric view of a standoff of the socket connector shown in FIG. 2 of the present invention.
Figure 4:
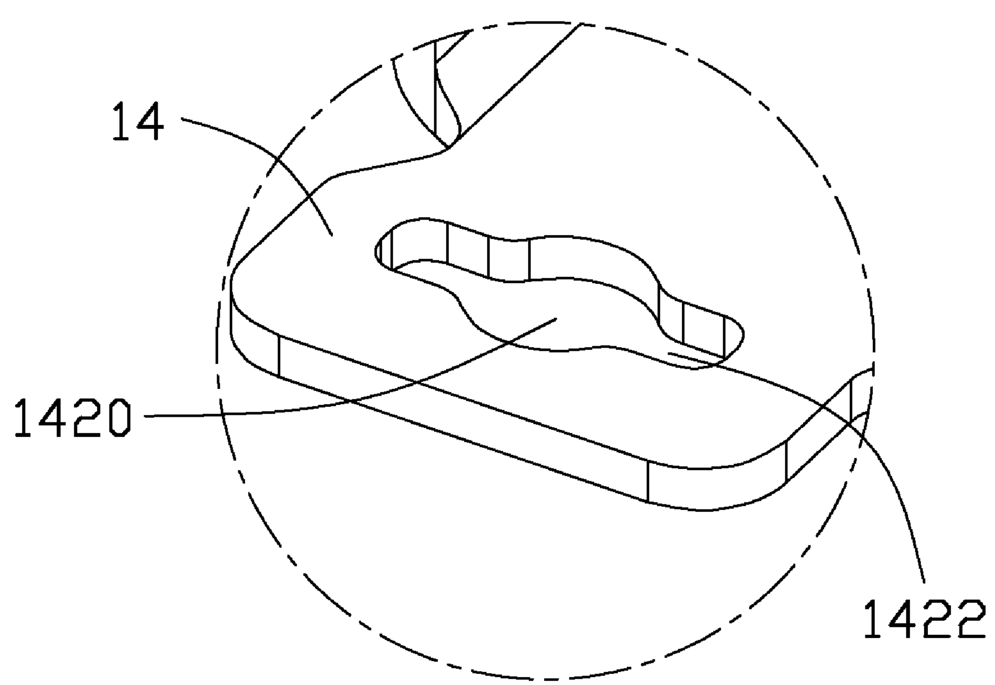
FIG. 4 is an enlarged view of the labeled portion X shown in FIG. 2.

Referring to FIGS. 1-3, the stiffener 14 defines an opening 140 at a central portion adapted to have the insulative housing 10 received therein. The stiffener 14 defines four mounting holes 142 at four corners. Each mounting hole 142 extends through both an upper surface 144 and a lower surface 146 of the stiffener 14. Each mounting hole 142 comprises a middle portion 1420 and two positioning portions 1422 located at opposite sides of the middle portion 1420. In the present invention, the positioning portions 1422 are communicated with the middle portion 1420 respectively. The positioning portion 1422 is dimensioned to be smaller than that of the middle portion 1420.

Figure 5:
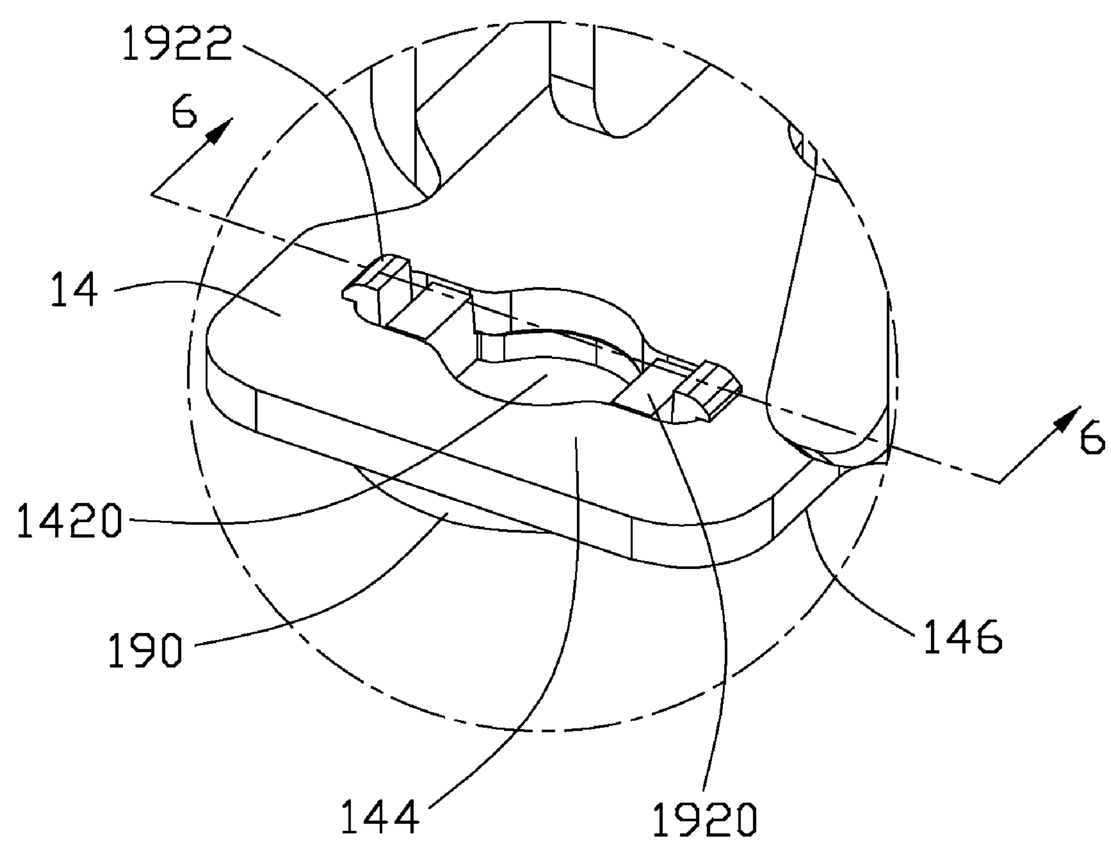
FIG. 5 is an enlarged view of the labeled portion Y shown in FIG. 1.
Figure 6:
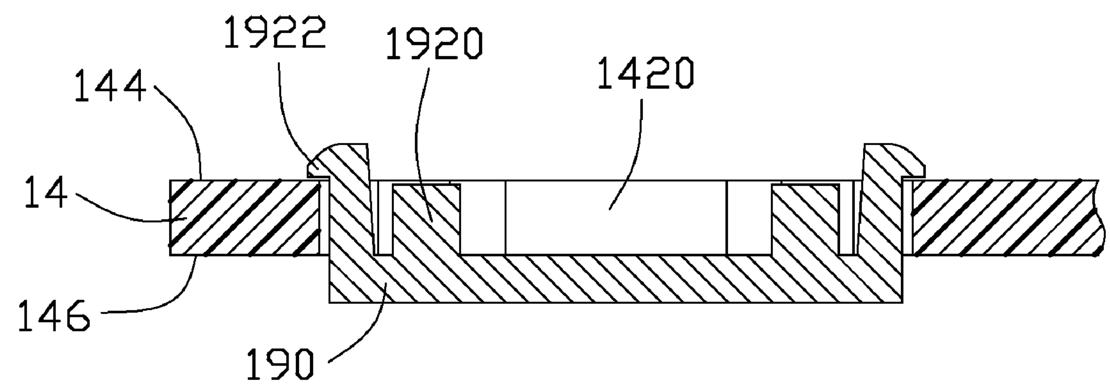
FIG. 6 is a cross-sectional view taken along line 6-6 in FIG. 5.

Referring to FIGS. 2, and 5-6, the socket connector 1 further comprises four standoffs 19 received in the mounting holes 142. The standoff 19 is used for securing the stiffener 14 onto a PCB (not shown) jointly with a screw member (not shown). The standoff 19 comprises a base portion 190 located under the lower surface 146 of the stiffener 14 and an insertion portion 192 inserted into the mounting holes 142 of the stiffener 114.

The insertion portion 192 comprises a pair of posts 1920 and a pair of latch members 1922. The posts 1920 are arranged symmetrical with respect to a middle center of the base portion 190, and two latch members 1922 arranged symmetrical with respect to the middle center of the base portion 190.

When the insertion portion 192 of the standoff 19 is inserted into the mounting hole 142, the post 1920 and the latch member 1922 are securely received in the positioning portion 1922. The post 1920 is rigid and fixed on the base portion 192 of the standoff. The post 1920 will prevent the standoff 19 from spinning when the standoff 19 engages with the mounting hole 142. The latch member 1922 have a hook end grasped the upper surface 144 of the stiffener 14 at an edge region of the mounting hole 142, so as to prevent the standoff 19 from falling off from the mounting hole 142. Accordingly, reliability of interconnecting engagement between the standoff 19 and the mounting hole 142 is improved.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. A socket connector comprising:

a housing with a plurality of contacts therein;

a stiffener surrounding the housing and defining a plurality of mounting holes;

a plurality of standoffs each inserted into a corresponding mounting hole of the stiffener, each standoff comprising at least one post for positioning the standoff in the mounting hole along a transverse direction and at least one latch member adjacent to the at least one post for restricting the standoff in the mounting hole along a vertical direction perpendicular to the transverse direction, a gap being formed between the at least one post and the at least one latch member for deformation of the at least one latch member; wherein the at least one latch member comprising a hook engaging against a top surface of the stiffener along the vertical direction so as to prevent the standoff from falling off from the mounting hole, wherein each standoff comprises two posts arranged in a symmetrical manner with respect to a middle center thereof, and two latch members arranged in a symmetrical manner with respect to the middle center thereof, wherein each mounting hole comprises a middle hole and two positioning holes located at opposite sides of the middle hole, the two positioning holes being in communication with the middle hole, the two posts and the two latch members being received in the two positioning holes, wherein each of the positioning holes is narrower than the middle portion hole, wherein the standoff comprises a base portion with the at least one post and the at least one latch member extending upwardly therefrom, the base portion being sized larger than the mounting hole so as to abut against a bottom surface of the stiffener.

2. The socket connector as claimed in claim 1, further comprising a cover pivotably mounted at a rear portion of the stiffener and a lever pivotably mounted at a front portion of the stiffener.

3. The socket connector as claimed in claim 1, wherein the at least one latch member is outwardly inclined with respect to the at least one post.

4. A socket connector for interconnecting two electronic components, comprising:

a housing;

a stiffener surrounding the housing and defining a plurality of mounting holes;

a plurality of standoffs each comprising an insertion portion inserted into and engaging with a corresponding mounting hole of the stiffener, wherein the insertion portion comprises a fixed portion for horizontally positioning the standoff in the mounting hole and a flexible portion for vertically restricting the standoff in the mounting hole; and wherein the flexible portion is located outside of the fixed portion with a gap formed therebetween for deformation of the flexible portion; and wherein the flexible portion is outwardly inclined with respect to the fixed portion, wherein the fixed portion includes a pair of posts and the flexible portion includes a pair of latch members; and wherein the pair of posts are arranged in a symmetrical manner with respect to a middle center thereof, and the pair of latch members are arranged in a symmetrical manner with respect to the middle center as well, the standoff comprises a base portion with the fixed portion and the flexible portion unitarily extending upwardly therefrom, the flexible portion comprising a hook engaging against a top surface of the stiffener so as to vertically prevent the standoff from falling off from the mounting hole, wherein the hook extends beyond a corresponding lateral edge of the base portion from a top view.

5. The socket connector as claimed in claim 4, wherein the flexible portion defines an inclined surface sidewardly facing the fixed portion.

6. The socket connector as claimed in claim 1, wherein each mounting hole comprises a middle hole and two positioning holes located at opposite sides of the middle hole, the two positioning holes being in communication with the middle hole, the pair of posts and the pair of latch members being received in the two positioning holes.

7. The socket connector as claimed in claim 6, wherein each of the positioning holes is narrower than the middle hole.

8. The socket connector as claimed in claim 4, further comprising a cover pivotably mounted at a rear portion of the stiffener and a lever pivotably mounted at a front portion of the stiffener.

9. A socket assembly comprising:

a metallic stiffener surrounding an insulative housing with terminals therein;

a plurality of through holes defined in corners of said stiffener;

a metallic lever pivotally mounted to one end of the stiffener;

a metal load cover pivotally mounted to the other end of the stiffener;

a plurality of insulative standoffs associated with the corresponding through holes, respectively, each of said standoffs including a planar base portion from which a relatively rigid post and a relatively resilient latch unitarily extend, respectively, with a gap therebetween; wherein the post performs retention with regard to the corresponding through hole in a transverse direction while the latch performs retention with regard to the corresponding through hole in a vertical direction perpendicular to said transverse direction; and wherein said latch comprises a hook engaging against a top surface of said metallic stiffener along the vertical direction, wherein said post further provides a stopper function with regard to the latch for preventing deflection of said latch, wherein said latch is essentially located outside of the post with regard to a center of the base portion, wherein said hook extends beyond the top surface of said metallic stiffener while the post does not, wherein said latch is outwardly inclined with respect to the post.

* * * * *